US 6,576,912 B2

United States Patent
Visser et al.

(10) Patent No.: US 6,576,912 B2
(45) Date of Patent: Jun. 10, 2003

(54) LITHOGRAPHIC PROJECTION APPARATUS EQUIPPED WITH EXTREME ULTRAVIOLET WINDOW SERVING SIMULTANEOUSLY AS VACUUM WINDOW

(76) Inventors: Hugo M. Visser, Longe Louweratraat 52bls, NL-3512 VK Utrecht (NL); Richard L. Sandstrom, 410 Bridoon Ter., Encinatas, CA (US) 92024; Theodorus H. J. Bisschops, P.O. Box 2227, NL-5600 CE Eindhoven (NL); Vadim Y. Banine, Niersiaan 2., NL-5704 NK Helmond (NL); Jeroen Jonkers, Hendrik Casimirstraat 8, NL-5616 BK Eindhoven (NL)

( * ) Notice: Subject to any disclaimer, the term of this patent is extended or adjusted under 35 U.S.C. 154(b) by 231 days.

(21) Appl. No.: 09/752,818

(22) Filed: Jan. 3, 2001

(65) Prior Publication Data

US 2002/0084428 A1 Jul. 4, 2002

(51) Int. Cl.⁷ .............................. G21G 5/00; G01J 3/00; G03B 27/70; G03B 27/54
(52) U.S. Cl. ............................. 250/492.2; 250/504 R; 356/51; 359/353; 355/66; 355/67
(58) Field of Search .................... 250/492.2, 504 R; 356/354, 928, 929; 359/361.353; 355/68–66

(56) References Cited

U.S. PATENT DOCUMENTS

| 5,175,755 A | | 12/1992 | Kumakhov | |
| 6,118,535 A | * | 9/2000 | Goldberg et al. | 356/521 |
| 6,449,086 B1 | * | 9/2002 | Singh | 359/361 |
| 6,452,194 B2 | * | 9/2002 | Bijkerk et al. | 250/492.2 |
| 6,459,472 B1 | * | 10/2002 | De Jager et al. | 355/68 |
| 2002/0084428 A1 | * | 7/2002 | Visser et al. | 250/492.2 |
| 2002/0097385 A1 | * | 7/2002 | Van Elp | 355/67 |
| 2002/0134947 A1 | * | 9/2002 | Van Schaik | 250/492.1 |

FOREIGN PATENT DOCUMENTS

| DE | 3808629 C1 | 3/1988 |
| DE | WO 01/01736 A1 | 1/2001 |
| WO | WO 99/42904 | 8/1999 |
| WO | WO 01/01736 A1 | 1/2001 |

OTHER PUBLICATIONS

Peele et al., "Square capillary x–ray optics", in SPIE proceeding vol. 2015, availble from the Website http://www.spie.org/web/abstracts/2000/2015.html.*

"Extreme Ultraviolet Lithography", available from Internet Website http://courses.nus.edu.sg/course/phyweets/Project99/Optyical/EUV1.htm.*

Lucatorto, T., Capillary Array: A New Type of Window for the Vacuum Ultraviolet, Applied Optics, Jul.1979, pp. 2505–2509.

* cited by examiner

Primary Examiner—John R. Lee
Assistant Examiner—Bernard E. Souw
(74) Attorney, Agent, or Firm—Pillsbury Winthrop LLP

(57) ABSTRACT

A lithographic projection apparatus has a discharge plasma radiation source that is contained in a vacuum chamber. The radiation source is to generate a beam of EUV radiation. A chamber wall of the vacuum chamber incorporates a channel structure comprising adjacent narrow channels separated by walls that are substantially parallel to a propagation direction of the radiation generated so as to pass the radiation from the vacuum chamber through the structure to another subsequent vacuum chamber. In the subsequent vacuum chamber, a much higher vacuum level (lower pressure) can be maintained than is present in the vacuum chamber of the radiation source.

23 Claims, 3 Drawing Sheets

LITHOGRAPHIC PROJECTION APPARATUS EQUIPPED WITH EXTREME ULTRAVIOLET WINDOW SERVING SIMULTANEOUSLY AS VACUUM WINDOW

BACKGROUND OF THE INVENTION

1. Field of the Invention

The invention relates an extreme ultraviolet radiation transparent structure in a vacuum wall. More particularly, the invention relates to the use of the transparent structure in a lithographic projection apparatus comprising:

an illumination system constructed and arranged to supply a projection beam of radiation;

a mask table constructed to hold a mask;

a substrate table constructed to hold a substrate; and a projection system constructed and arranged to image an irradiated portion of the mask onto a target portion of the substrate.

2. Discussion of Related Art

For the sake of simplicity, the projection system may hereinafter be referred to as the "lens"; however, this term should be broadly interpreted as encompassing various types of projection system, including refractive optics, reflective optics and catadioptric systems, for example. In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described in International Patent Applications WO 98/28665 and WO 98/40791, for example.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target area (comprising one or more dies) on a substrate (silicon wafer) which has been coated with a layer of radiation-sensitive material (resist). In general, a single wafer will contain a whole network of adjacent target areas which are successively irradiated via the mask, one at a time. In one type of lithographic projection apparatus, each target area is irradiated by exposing the entire mask pattern onto the target area in one go; such an apparatus is commonly referred to as a wafer stepper. In an alternative apparatus, which is commonly referred to as a step-and-scan apparatus, each target area is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned from International Patent Application WO 97/33205.

In a lithographic apparatus the size of features that can be imaged onto the substrate is limited by the wavelength of the projection radiation. To produce integrated circuits with a higher density of devices, and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13 nm. Such radiation is termed extreme ultraviolet radiation, also referred to as XUV or EUV radiation. XUV generally refers to the wavelength range from several tenths of nanometer to several tens of nanometers, combining the soft x-ray and vacuum UV range, whereas EUV is normally used in conjunction with lithography (EUVL) and refers to a radiation band from approximately 5 to 20 nm, i.e. part of the XUV range.

Possible sources include, for instance, laser-produced plasma sources, discharge plasma sources, or synchrotron radiation from electron storage rings. An outline design of a lithographic projection apparatus using synchrotron radiation is described in "Synchrotron Radiation Sources and Condensers for Projection X-Ray Lithography", J. B. Murphy et al, Applied Optics, Vol. 32, No. 24, pp. 6920–6929 (1993). Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136–156 (2000); M. W. McGeoch, "Power Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fornaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999). So-called "undulators" and "wigglers" have been proposed as an alternative source of extreme ultraviolet radiation. In these devices, a beam of electrons traveling at high, usually relativistic, speeds, e.g. in a storage ring, is caused to traverse a series of regions in which magnetic fields perpendicular to the beam velocity are established. The directions of the magnetic field in adjacent regions are mutually opposite, so that the electrons follow an undulating path. The transverse accelerations of the electrons following the undulating path cause the emission of Maxwell radiation perpendicular to the direction of the accelerations, i.e. in the direction of the non-deviated path.

Radiation sources may require the use of a rather high partial pressure of a gas or vapor to emit XUV radiation, such as discharge plasma radiation sources referred to above. In a discharge plasma source a discharge is created in between electrodes, and a resulting partially ionized plasma is subsequently caused to collapse to yield a very hot plasma that emits radiation in the XUV range. The very hot plasma is quite often created in Xe, since a Xe plasma radiates in the EUV range around 13.5 nm. For an efficient EUV production, a typical pressure of 0.1 mbar is required near the electrodes of the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To reach this the source can be contained in its own vacuum chamber that is separated by a chamber wall from a subsequent vacuum chamber in which the collector mirror and illumination optics may be contained. However, an EUV radiation transparent opening is needed to pass the EUV radiation emitted by the source to the next vacuum chamber. Since a large opening in the wall, required to collect sufficient EUV radiation, would cause an elevated pressure in the next vacuum chamber, the opening might be closed off using a thin window of a few micron thickness or less, which is (partially) transparent for EUV radiation. Such a thin window will, however, not survive the heat load from the high-power EUV radiation source that is needed for EUV lithography.

SUMMARY OF THE INVENTION

It is an object of the present invention is to provide a structure in a vacuum chamber wall that is transparent for EUV radiation and further presents a gas barrier so as to be able to maintain different vacuum levels in vacuum chambers on both sides of the vacuum chamber wall.

Further objects of the invention will become apparent from the description of the invention that follows.

According to a first aspect of the present invention there is provided a lithographic projection apparatus comprising an illumination system constructed and arranged to supply a projection beam of radiation; a mask table constructed to hold a mask; a substrate table constructed to hold a substrate; and a projection system constructed and arranged to image an irradiated portion of the mask onto a target portion of the substrate; and further comprising two vacuum chambers separated by a chamber wall incorporating a channel structure comprising adjacent narrow channels separated by walls that are substantially parallel to a propagation direction of said radiation so as to pass said radiation from one of said vacuum chambers to the other one, said propagation direction being substantially along an optical axis of said apparatus.

According to a second aspect of the invention there is provided an optical apparatus comprising a radiation source constructed to generate a beam of radiation; and two vacuum chambers separated by a chamber wall incorporating a channel structure comprising adjacent narrow channels separated by walls that are substantially parallel to a propagation direction of said radiation so as to pass said radiation from one of said vacuum chambers to the other one, said propagation direction being substantially along an optical axis of said apparatus.

According to yet a further aspect of the invention there is provided a method of manufacturing a device using a lithographic projection apparatus comprising an illumination system constructed and arranged to supply a projection beam of radiation; a mask table constructed to hold a mask containing a mask pattern; a substrate table constructed to hold a substrate that is at least partially covered by a layer of radiation-sensitive material; and a projection system constructed and arranged to image an irradiated portion of the mask onto a target portion of the substrate, and further comprising two vacuum chambers separated by a chamber wall incorporating a channel structure comprising adjacent narrow channels separated by walls that are substantially parallel to a propagation direction of said radiation so as to pass said radiation from one of said vacuum chambers to the other one, said propagation direction being substantially along an optical axis of said apparatus, said method comprising the step of using the projection beam of irradiation to project an image of at least a portion of the mask pattern onto a target portion on the substrate.

In a manufacturing process using a lithographic projection, a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

Further, this description concentrates on lithographic apparatus and methods employing a mask to pattern the radiation beam entering the projection system and it should be noted that the term "mask" should be taken in a broad context of lithographic apparatus and methods. "Mask" should be interpreted as generally referring to generic "patterning means" to pattern the said radiation beam. The terms "mask" and "patterning means" as here employed refer broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. The term "mask table" should be broadly interpreted as any means for holding the "patterning means". Besides a mask plate or reticle on a mask table, such patterning means include the following exemplary embodiments:

a programmable mirror array. An example of such a device is an addressable surface having a control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the addressable surface. The required matrix addressing can be performed using suitable electronic means. More information on such mirror arrays can be gleaned, for example, from U.S. Pat. Nos. 5,296,891 and 5,523,193, which are incorporated herein by reference; and a programmable LCD array. An example of such a construction is given in U.S Pat. No. 5,229,872, which is incorporated herein by reference.

BRIEF DESCRIPTION OF THE DRAWINGS

The invention and its attendant advantages will be further elucidated with the aid of an exemplary embodiment and the accompanying schematic drawings, in which like reference symbols indicate like parts and in which.

DETAILED DESCRIPTION OF THE PREFERRED EMBODIMENTS

Figure 1:
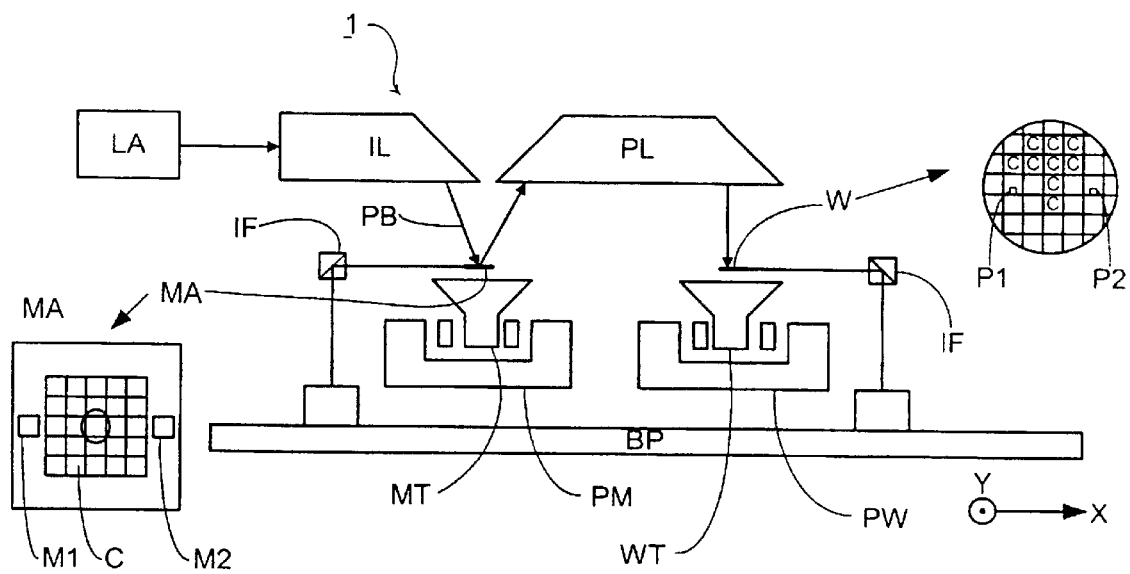
FIG. 1 depicts a lithographic projection apparatus according to an embodiment of the invention.

FIG. 1 schematically depicts a lithographic projection apparatus 1 according to the invention. The apparatus comprises:

- a radiation system LA, IL for supplying a projection beam PB of EUV radiation;
- a first object table (mask table) MT provided with a first object (mask) holder for holding a mask MA (e.g. a reticle), and connected to first positioning means PM for accurately positioning the mask with respect to item PL;
- a second object table (substrate table) WT provided with a second object (substrate) holder for holding a substrate W (e.g. a resist-coated silicon wafer), and connected to second positioning means PW for accurately positioning the substrate with respect to item PL; and
- a projection system ("lens") PL (e.g. a refractive, catadioptric or reflective system) for imaging an irradiated portion of the mask MA onto a target portion C (die) of the substrate W.

As here depicted, the apparatus is of a reflective type (i.e. has a reflective mask). However, in general, it may also be of a transmissive type, for example.

The radiation system comprises a discharge plasma source LA that produces a beam of radiation. This beam is passed along various optical components included in illumination system ("lens") IL so that the resultant beam PB is collected in such a way as to give illumination of the desired shape and intensity distribution at the entrance pupil of the projection system and the mask.

The beam PB subsequently impinges upon the mask MA which is held in the mask holder on the mask table MT. Having been selectively reflected by the mask MA, the beam PB passes through the lens PL, which focuses the beam PB onto a target area C of the substrate W. With the aid of the interferometric displacement measuring means IF and positioning means PW, the substrate table WT can be moved accurately, e.g. so as to position different target areas C in the path of the beam PB. Similarly, the positioning means PM and interferometric displacement measuring means IF can be used to accurately position the mask MA with respect to the path of the beam PB. In general, movement of the object tables MT, WT will be realized with the aid of a long-stroke module (course positioning) and a short-stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB; and
2. In scan mode, essentially the same scenario applies, except that a given target area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Figure 2:
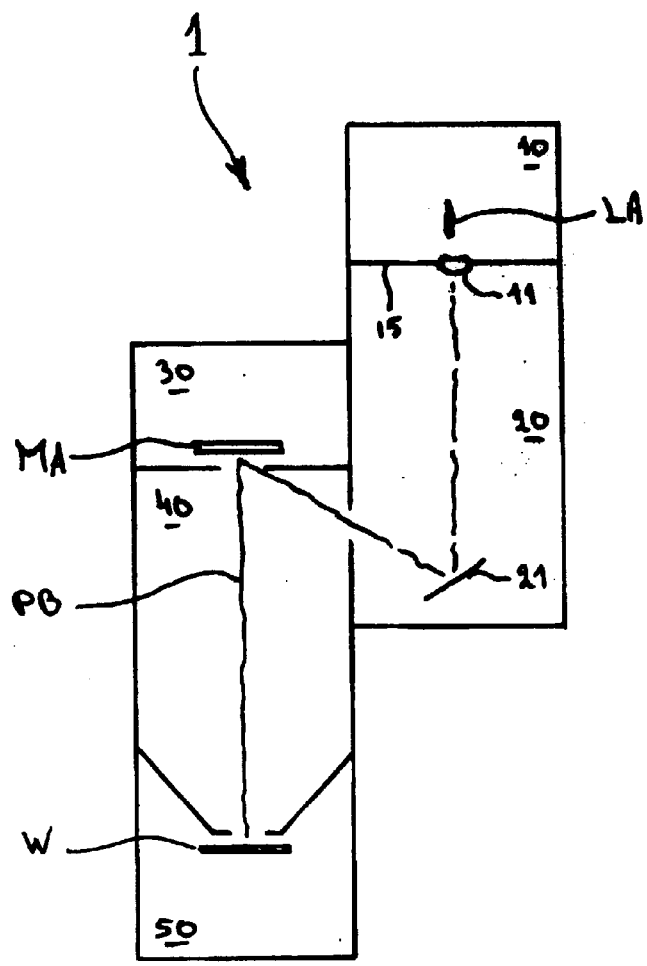
FIG. 2 depicts the various vacuum chamber, or compartments, separated by chamber walls of the apparatus of FIG. 1.

FIG. 2 depicts the various vacuum chambers of the lithographic apparatus of FIG. 1, the various parts shown in FIG. 1 being located in the various chambers shown in FIG. 2. The vacuum chambers are separated by walls in which openings are present for passing the projection beam of radiation PB from one vacuum chamber to the next one. In FIG. 2 one can distinguish a source chamber 10 containing the source LA, an illumination optics box 20 containing a collector mirror and the illumination optics, a chamber 30 containing the mask table and mask MA, a projection optics box 40 containing the projection system, and a chamber containing the substrate table and substrate W. In the various vacuum chambers a different vacuum level is maintained, the optics boxes requiring the highest vacuum level to keep the reflective optics clean.

The apparatus is provided with a discharge plasma EUV radiation source, which employs a gas or vapor, such as Xe gas or Li vapor, in which a very hot plasma is created to emit radiation in the EUV range of the electromagnetic spectrum. The very hot plasma is created by causing a partially ionized plasma of an electrical discharge to collapse onto an optical axis of the system, and the region in which the plasma collapses will, in general, have a finite length along the optical axis. The elongated region into which the plasma collapses is designated LA in FIGS. 2, 3 and 4. Partial pressures of 0.1 mbar Xe, Li vapor or any other suitable gas or vapor may be required for efficient generation of EUV radiation.

Figure 3:
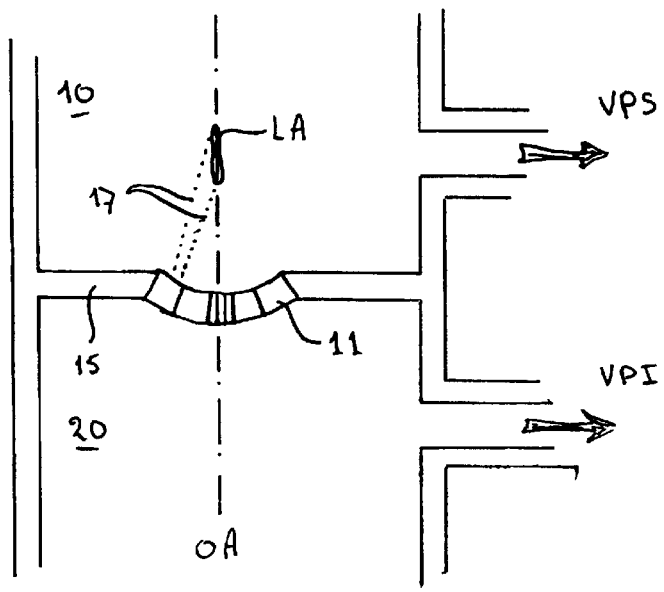
FIG. 3 depicts a part of FIG. 2 in more detail.

The radiation source LA is contained in its own source chamber 10, shown in more detail in FIG. 3, to confine those rather high partial pressures to the region of the source. Radiation emitted by the source is subsequently passed from the source chamber 10 to the illumination optics box 20. A filter having a channel structure 11 is incorporated on the optical axis OA in the vacuum chamber wall 15 that separates the source chamber from the illumination optics box. The channel structure 11 comprises adjacent narrow channels 12 separated by walls that are substantially parallel to a propagation direction of radiation emitted by the radiation source LA, the propagation direction being substantially directed along the optical axis OA. The channel structure passes the EUV radiation emitted by the source and at the same time functions as a flow resistance, or barrier, in between the source chamber and the illumination optics box so as to be able to maintain the illumination optics box, or illuminator box, at a much higher vacuum level (lower pressure) than the source chamber. The form and length of the channels in the channel structure should be chosen so as to provide a high EUV transparency and a high enough flow resistance.

Figure 4:
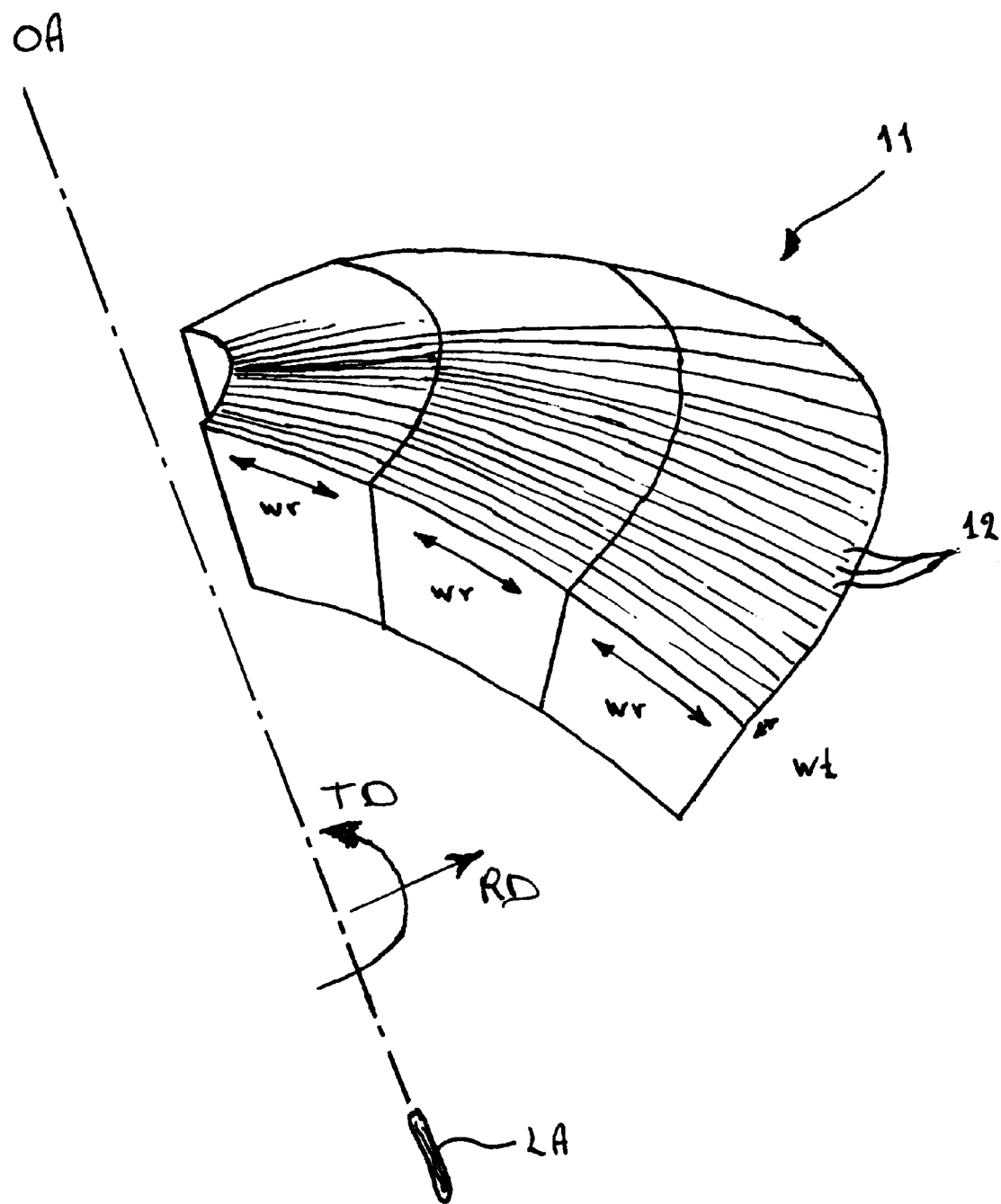
FIG. 4 depicts a perspective view of a part of an extreme ultraviolet radiation transparent structure incorporated in a chamber wall shown in FIG. 3.

FIG. 3 also shows that the radiation is sort of radially emitted from the elongated region LA. To increase the transparency of the channel structure, the width of the channels in the structure increases along the optical axis OA in the propagation direction of the radiation, both in the plane of the drawing and in a plane perpendicular to the plane of the drawing of FIG. 3. In such a configuration the walls of the channels are directed more parallel to the propagation direction of the radiation emitted from the source. The channel structure is rotationally symmetric around the optical axis OA, as is further shown in FIG. 4. FIG. 4 only depicts about a quarter of the channel structure 11.

FIGS. 3 and 4 further show that the region LA from which EUV radiation is emitted, is elongated along the optical axis, i.e. it has a finite length along the optical axis. To further increase the transmittance of radiation through the channel structure for the whole elongated region that emits radiation, the width wr of the of the channels in a direction perpendicular to the optical axis, i.e. the radial direction RD with respect to the optical axis OA, is chosen considerably larger than the width wt of the channels in a tangential direction TD around the optical axis OA. FIG. 4 better shows those width dimensions. In case the channels would have a narrow width in the radial direction RD, only radiation from a very small part from the elongated emitting region LA would be transmitted through the channels, while radiation from other parts would hit the channel walls. Only a small fraction of the radiation energy of the source would then pass the channel structure 11. FIG. 3 shows two rays 17 in dotted lines, which are emitted from opposite ends of the elongated region LA, the rays not being parallel and entering one channel. A channel that is to narrow in the radial direction RD would not pass both rays.

The gas flow conductance of the channel structure, or its resistance to gas flow, can be derived as follows. It shows that the result of the division of an opening in a vacuum chamber wall in a number of adjacent channels drastically reduces the conductance of the opening. In a simplified calculation, which is accurate within approximately 10%, the conductance $C_T$ of the channel structure can be written as $C_T=C_M+C_V$, where $C_M$ represents the molecular conductance and $C_V$ the laminar conductance. A further background for such calculations can be found in "Foundations of Vacuum Science and Technology", edited by J. M. Lafferty, Wiley & Sons Inc., 1998, ISBN 0-471-17593-5. For high Knudsen numbers (>0.5) $C_M$ dominates, whereas $C_V$ dominates for low Knudsen numbers. In the so-called transition regime, which is the case for the situation considered, both contributions have to be taken into account.

Taking the structure of FIG. 4 and assuming that it covers 2.4 steradians at 7 cm distance from the source, it has a surface area of approximately 114 $cm^2$. Having channels that are approximately 20 mm long, 0.5 mm wide in the tangential direction and 20 mm wide in the radial direction with respect to the optical axis and having Xe at a source pressure of 0.1 mbar, it results in $C_M$=50 l/s, $C_V$=4 l/s and $C_T$=54 l/s.

In an equilibrium situation the gas flow through the channel structure equals the flow into a vacuum pump VPI connected to the illuminator box 20:

(Psource−Pilluminator)×$C_T$=Pilluminator×Seff, wherein Psource represents the pressure in the source chamber, Pilluminator the pressure in the illuminator box and Seff the effective pumping speed of the vacuum pump VPI connected to the illuminator box. Another vacuum pump VPS will generally be connected to the source chamber 10. Aiming at Pilluminator<<Psource one obtains:

Pilluminator/Psource=$C_T$/Seff=54/6000=1/111=0.009, when having a vacuum pump VPI, such as a turbomolecular pump, of Seff=6000 l/s effective pumping speed.

The above calculation shows that due to the channel structure a sufficient flow resistance can be reached to have more than a factor 100 reduction in Xe pressure. For the case above the source pressure is at such a low level that the molecular regime dominates. In general, $C_M$ scales with the inverse square root of the molecular mass of the gas considered, and $C_V$ scales with source pressure. For higher source pressures and lower molecular masses the channel structure would be less efficient. By increasing the aspect ratio (ratio of channel length over smallest channel width) of the channels, the resistance can be increased, as required, to regain efficiency. When keeping the aspect ratio constant, the length of the channels can be decreased while keeping $C_T$ constant.

In case the channel structure is positioned closer to the source, its surface area is smaller and its conductance decreases accordingly. A drawback would be vignetting due to the finite dimension of the source and a higher heat load of the source on the channel structure. The channel structure should be made of a suitable material to withstand the heat load of the radiation source. The walls of the channels are preferably very thin (foils) to present a very low obscuration to the radiation from source LA.

Figure 5:
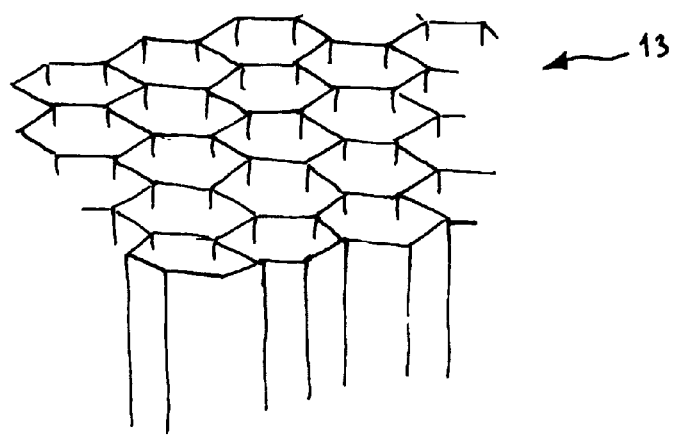
FIG. 5 depicts a further perspective of the extreme ultraviolet radiation transparent structure incorporated in the chamber wall shown in FIG. 3.

Channels in the middle of channel structure 11 around optical axis OA are not shown in FIG. 4. The channels in this part will more or less "see" a point source and it is therefore less important to have a large width in the radial direction RD. The embodiment shown comprises channels having a honeycomb structure as is depicted in FIG. 5 in the middle part of the channel structure 11. The diameter of the channels in the honeycomb structure is approximately 0.3 mm and their length approximately 20 mm. For certain source configurations the honeycomb structure might also be employed for the whole channel structure 11.

The radiation source used may emit particles that are detrimental to any optics arranged along the optical axis. Those particles can be charged and/or move with a high velocity. The channel structure as described above will also act as a filter to prevent those particles from reaching the optics, and it need not be incorporated in a vacuum wall to perform such filtering. Particles emitted by the source will become trapped in the channel structure. Such a filter comprising a channel structure as described may be mounted in any manner so as to be able to prevent those particle from reaching components that may be damaged by the emitted particles.

Whilst a specific embodiment of the invention is disclosed above it will be appreciated that the invention may be practiced other than described. The description is not intended to limit the invention. For instance, the channel structure may be employed with other gases to present a flow resistance, and a decreased flow conductance accordingly. Further, the channel structure may be incorporated in a vacuum wall separating other vacuum chambers, such as in the vacuum wall separating the projection optics box and the substrate chamber to present a barrier to contaminants that may escape from the radiation-sensitive resist layer on the substrate upon exposure. Also the considerations with regard to the channel width along the optical axis for a diverging beam of radiation may hold at other locations. For a converging beam of radiation the width of the channels should decrease along the optical axis in the propagation direction of the radiation. Since elongated images of the elongated source may be formed at locations on the optical axis, the considerations with regard the widths of the channels in the radial and tangential directions with respect to the optical axis will also hold at those locations.

We claim:

1. A lithographic projection apparatus comprising:

an illumination system constructed and arranged to supply a projection beam of radiation;

a mask table constructed to hold a mask;

a substrate table constructed to hold a substrate; and a projection system constructed and arranged to image an irradiated portion of the mask onto a target portion of the substrate; and further comprising:

two vacuum chambers separated by a chamber wall incorporating a channel structure comprising adjacent narrow channels separated by walls that are substantially parallel to a propagation direction of said radiation so as to pass said radiation from one of said vacuum chambers to the other one, said propagation direction being substantially along an optical axis of said apparatus.

2. An apparatus according to claim 1, wherein a width of said channels increases or decreases along said optical axis in accordance with passing of a diverging or converging beam of radiation, respectively.

3. An apparatus according to claim 1, wherein said channel structure comprises a honeycomb structure.

4. An apparatus according to claim 1, wherein a cross-sectional dimension of said channels in a radial direction perpendicular to said optical axis is larger than another cross-sectional dimension of said channels in a tangential direction around said optical axis.

5. An apparatus according to claim 4, wherein said width in the tangential direction is in the range from 0.1 to 2 mm.

6. An apparatus according to claim 4, wherein said width in the radial direction is in the range from 5 to 50 mm.

7. An apparatus according to claim 1, wherein a length of said channel is in the range from 5 to 70 mm.

8. An apparatus according to claim 1, wherein said apparatus further comprises a radiation source contained in one of said vacuum chambers.

9. An apparatus according to claim 1, wherein said radiation source is a plasma source for generating extreme ultraviolet radiation.

10. An apparatus according to claim 9, wherein said radiation source is a discharge plasma source.

11. An apparatus according to claim 1, wherein the radiation is extreme ultraviolet radiation having a wavelength in the range from 0.5 to 50 nm.

12. A method of manufacturing a device using a lithographic projection apparatus comprising:

an illumination system constructed and arranged to supply a projection beam of radiation;

a mask table constructed to hold a mask containing a mask pattern;

a substrate table constructed to hold a substrate that is at least partially covered by a layer of radiation-sensitive material; and a projection system constructed and arranged to image an irradiated portion of the mask onto a target portion of the substrate, and further comprising:

two vacuum chambers separated by a chamber wall incorporating a channel structure comprising adjacent narrow channels separated by walls that are substantially parallel to a propagation direction of said radiation so as to pass said radiation from one of said vacuum chambers to the other one, said propagation direction being substantially along an optical axis of said apparatus, said method comprising the step of:

using the projection beam of irradiation to project an image of at least a portion of the mask pattern onto a target portion on the substrate.

13. A device manufactured according to the method of claim 12.

14. A method according to claim 12, wherein said illumination system comprises a radiation source contained in one of said vacuum chambers.

15. A method according to claim 12, wherein said illumination system comprises a plasma source for generating extreme ultraviolet radiation.

16. A method according to claim 12, wherein said radiation source is a discharge plasma source.

17. A method according to claim 12, wherein a width of said channels increases or decreases along said optical axis in accordance with passing of a diverging or converging beam of radiation, respectively.

18. A method according to claim 12, wherein said channel structure comprises a honeycomb structure.

19. A method according to claim 12, wherein a cross-sectional dimension of said channels in a radial direction perpendicular to said optical axis is larger than another cross-sectional dimension of said channels in a tangential direction around said optical axis.

20. A method according to claim 19, wherein said width in the tangential direction is in the range from 0.1 to 2 mm.

21. A method according to claim 19, wherein said width in the radial direction is range from 5 to 50 mm.

22. A method according to claim 12, wherein a length of said channels is in the range from 5 to 70 mm.

23. A method according to claim 12, wherein the radiation is extreme ultraviolet radiation having a wavelength in the range from 0.5 to 50 nm.

* * * * *

UNITED STATES PATENT AND TRADEMARK OFFICE
CERTIFICATE OF CORRECTION

PATENT NO. : 6,576,912 B2  Page 1 of 1
DATED : June 10, 2003
INVENTOR(S) : Visser et al.

It is certified that error appears in the above-identified patent and that said Letters Patent is hereby corrected as shown below:

<u>Title page,</u>
Item [75], should read as follows:

-- [75] Inventors: Hugo M. Visser, Lange Lauwerstraat 52bis, NL-3512 VK Utrecht (NL); Richard L. Sandstrom, 410 Bridoon Ter., Encinatas, CA (US) 92024; Theodorus H. J. Bisschops, P.O. Box 2227, NL-5600 CE Eindhoven (NL); Vadim Y. Banine, Nierslaan 2., NL-5704 NK Helmond (NL); Jeroen Jonkers, Hendrik Casimirstraat 8, NL-5616 BK Eindhoven (NL) --

Signed and Sealed this

Fourth Day of November, 2003

JAMES E. ROGAN
*Director of the United States Patent and Trademark Office*